US009428830B2

(12) United States Patent
Chinn et al.

(10) Patent No.: US 9,428,830 B2
(45) Date of Patent: Aug. 30, 2016

(54) REVERSE CIRCULATION FLUIDIZED BED REACTOR FOR GRANULAR POLYSILICON PRODUCTION

(71) Applicant: GTAT Corporation, Merrimack, NH (US)

(72) Inventors: Wenjun L Chinn, Missoula, MT (US); F. Scott Fahrenbruck, Missoula, MT (US); Shawn D Skinner, Missoula, MT (US); Laura E Moran, Missoula, MT (US); Jeffrey C. Gum, Stevensville, MT (US)

(73) Assignee: GTAT Corporation, Merrimack, NH (US)

( * ) Notice: Subject to any disclaimer, the term of this patent is extended or adjusted under 35 U.S.C. 154(b) by 170 days.

(21) Appl. No.: 14/322,351

(22) Filed: Jul. 2, 2014

(65) Prior Publication Data
US 2016/0002773 A1    Jan. 7, 2016

(51) Int. Cl.
| C23C 16/442 | (2006.01) |
| C23C 16/24 | (2006.01) |
| C23C 16/52 | (2006.01) |
| C23C 16/44 | (2006.01) |
| C01B 33/027 | (2006.01) |

(52) U.S. Cl.
CPC .......... *C23C 16/442* (2013.01); *C01B 33/027* (2013.01); *C23C 16/24* (2013.01); *C23C 16/4417* (2013.01); *C23C 16/52* (2013.01)

(58) Field of Classification Search
None
See application file for complete search history.

(56) References Cited

U.S. PATENT DOCUMENTS

| 4,746,547 A * | 5/1988 | Brown ............... B01J 2/006 118/303 |
| 4,992,245 A | 2/1991 | Van Slooten et al. |
| 5,165,908 A | 11/1992 | Van Slooten et al. |
| 5,242,671 A | 9/1993 | Allen et al. |
| 5,326,547 A | 7/1994 | Allen et al. |

(Continued)

FOREIGN PATENT DOCUMENTS

| CN | 101780956 B | 6/2012 |
| WO | 9641036 A2 | 12/1996 |

OTHER PUBLICATIONS

PCT Search Report dated Sep. 17, 2015 of Patent Application No. PCT-US2015/038799 filed Jul. 1, 2015.

(Continued)

*Primary Examiner* — Erma Cameron
(74) *Attorney, Agent, or Firm* — Maine Cernota & Rardin

(57) ABSTRACT

A reverse fluidized bed reactor (FBR) is separated by a thermally insulating vertical divider into a pre-reaction heating zone, a reaction zone, and a dehydrogenation zone. The dehydrogenation zone can be distinct, or the heating zone can serve as the dehydrogenation zone. Particles of polysilicon circulate upward through the heating zone and into the top of the reaction zone, where deposition of silicon occurs, and the grown particles slowly settle until they reenter the bottom of the pre-reaction heating zone. Dust formation, wall deposition, and hydrogen content in the product silicon particles are thereby minimized.

13 Claims, 9 Drawing Sheets

(56) References Cited

U.S. PATENT DOCUMENTS

| | | | |
|---|---|---|---|
| 5,374,413 A | 12/1994 | Kim et al. | |
| 5,810,934 A * | 9/1998 | Lord | B01J 8/245 |
| | | | 118/725 |
| 6,827,786 B2 | 12/2004 | Lord | |
| 7,922,990 B2 | 4/2011 | Hertlein et al. | |
| 2005/0036940 A1 | 2/2005 | Grace et al. | |
| 2009/0047204 A1 | 2/2009 | Kim et al. | |
| 2009/0324479 A1 | 12/2009 | Kulkarni et al. | |
| 2010/0068116 A1 | 3/2010 | Kim et al. | |
| 2010/0290970 A1 * | 11/2010 | Staffin | B01J 8/34 |
| | | | 423/342 |
| 2011/0244124 A1 | 10/2011 | Kulkarni et al. | |
| 2012/0148728 A1 * | 6/2012 | Canle | C23C 16/24 |
| | | | 427/58 |
| 2014/0262981 A1 * | 9/2014 | Yun | B07B 11/06 |
| | | | 209/643 |

OTHER PUBLICATIONS

Wang, T., "Zero Net Production of SiCl4 in Manufacture of Polysilicon with FBR", Solarcon China 2013, 31 pgs.

* cited by examiner

REVERSE CIRCULATION FLUIDIZED BED REACTOR FOR GRANULAR POLYSILICON PRODUCTION

FIELD OF THE INVENTION

The invention relates to reactors for producing polysilicon, and more particularly, to fluidized bed reactors for producing polysilicon.

BACKGROUND OF THE INVENTION

Manufacturing polysilicon through chemical vapor deposition of silicon in a fluidized bed reactor (FBR) has advantages over the traditional Siemens process, which decomposes silane or chlorosilane onto silicon "slim" rods in a bell-jar reactor. With reference to FIG. 1A, which shows a specific design of one type of FBR reactor, at least one divider 102 divides a reactor chamber 100 into a pre-reaction heating zone 104 and a reaction zone 106. In the specific example of FIG. 1A, the divider is a cylindrical, vertical divider 102 so that the zones 104, 106 are concentric. Small "seed" particles of polysilicon are introduced through a particle inlet port 110 into the pre-reaction heating zone 104, where they are heated by a heater 108 to a temperature above the silicon deposition temperature of a reaction gas comprising at least one silicon-containing reagent. A pre-reaction fluidizing gas that does not contain silicon, typically hydrogen gas, is introduced through a pre-reaction gas port 112 into the pre-reaction heating zone 104, where it fluidizes the silicon particles.

The flow rate of the pre-reaction fluidizing gas is adjusted to a level that allows the silicon particles to slowly fall out of the pre-reaction heating zone and into the bottom of the reaction zone 106. There, they are fluidized by the reaction gas, which is introduced into the reaction zone 106 through a reaction gas port 114. Due to the high temperature of the silicon particles, the reaction gas is decomposed upon contact with the particles, and silicon is deposited onto the particles, causing them to grow. Eventually, the particles become too heavy for the reaction gas to lift, and they fall out of the reactor through an exit port 118. In some cases, such as the example given in FIG. 1A, the reaction gas is able to lift at least some of the silicon particles above the top of the separator 102, so that they fall back into the heating zone 104. This causes particles that cool before they are heavy enough to fall out of the reaction zone 106 to be re-circulated through the heating zone 104.

Silicon FBR technology has been industrialized for years. The advantages of FBR reactors, as compared to Siemens reactors, for silicon production include low energy consumption and continuous operation. In addition, the silicon product is in granular form, which can be handled readily in downstream processes for the making of silicon ingots and single crystals.

However, several problems still exist which affect the process and product quality. One of these problems is dust formation. As the reaction gas is heated by the seed particles, the temperature of at least some reaction gas molecules may rise above their decomposition temperature, even when they are not in direct contact with a silicon particle. As a result, molecules in the reaction gas can spontaneously decompose, forming very fine particles of silicon "dust." Dust formation in an FBR reactor is not only a waste of silicon, but is also hard to handle, due to its low density. When attached to the surfaces of the silicon product particles, dust also degrades the quality of the silicon product.

Another problem in conventional FBR reactors is deposition of the reaction gas on the vertical separator 102 and/or the walls of the FBR chamber 100. One way to heat up the particles in an FBR is to heat the walls of the pre-reaction heating zone 104 with external heaters, as shown in FIG. 1A, so that the walls transfer heat by conduction to the particles within the pre-reaction heating zone 104. In these configurations, the walls of the pre-reaction heating zone are hotter than the particles, and if any reaction gas reaches them, the result will be deposition of silicon on the walls. When the silicon layer on the walls gets too thick, the FBR operation must be stopped to allow removal of the silicon from the walls.

A third problem with conventional FBR reactors is the high concentration of hydrogen typically found in the granular polysilicon product. Hydrogen gas is often used as the pre-reaction fluidizing gas that is introduced through gas port 112, and hydrogen gas is also frequently a component of the reaction gas. Hydrogen trapped within and/or adsorbed onto the surface of product silicon particles can result in bubbles in the melting process downstream, which can be detrimental to the quality of ingots or crystals grown from the melt. Therefore, the hydrogen must first be removed from the granular silicon particles produced by an FBR reactor, before the silicon can be used. A typical approach is to dehydrogenate the silicon particles by transferring them to a separate dehydrogenation zone that is distinct from the FBR, where the particles are fluidized by hydrogen gas, or by some other dehydrogenation gas, and heated to a high temperature that drives off the hydrogen. However, this approach requires a separate process and separate equipment, which makes the process more complex, and increases both the capital and operating costs.

It is important to note the direction in which the silicon particles circulate in the FBR of FIG. 1A. This circulation direction is illustrated more clearly in FIG. 1B. The silicon particles move downward as they are heated in the pre-reaction heating zone 104 until they enter the bottom of the reaction zone 106, where they come into contact with the reaction gas. As a result, the silicon particles come into initial contact with the reaction gas in a region where the silicon concentration is highest, and the particles are at their maximum temperature. This accelerates the initial rate of silicon deposition, and reduces the amount of time that the particles must remain in the reactor, on average, before being removed as silicon product. The particles are then carried upward by the reaction gas, and those particles that do not receive sufficient silicon to fall out of the reactor through the exit port 118 are carried over the vertical separator 102 to once again fall downward and be heated in the pre-reaction heating zone 104.

Unfortunately, due to the higher flow rate of the reaction gas, which carries the particles upward, as compared to the pre-reaction fluidizing gas, which allows the particles to drift downward, it is inevitable that some of the reaction gas will also flow over or under the vertical separator 102 and thereby enter into the pre-reaction heating zone, where it will readily form silicon dust and deposit silicon on the heated walls.

What is needed, therefore, is a polysilicon FBR reactor that produces less silicon dust, minimizes deposition of silicon on the walls, heaters, and zone dividers, and produces silicon product with reduced hydrogen content, so that a separate dehydrogenation step is not needed.

SUMMARY OF THE INVENTION

A fluidized bed reactor (FBR) with reverse flow minimizes production of silicon dust, minimizes deposition of silicon on the walls, heaters, and zone dividers, and produces silicon product with reduced hydrogen content, so that a separate dehydrogenation step is not needed. The reactor provides a pre-reaction heating gas flow that lifts the particles of polysilicon upward through the pre-reaction heating zone, so that they enter the reaction zone and first encounter the reaction gas at the top of the reaction zone, rather than at the bottom. The flow of reaction gas is relatively weaker, so as to allow the particles to slowly settle through the reaction zone and re-enter the bottom of the pre-reaction heating zone. As a result, the circulation of the silicon particles through the reactor is reversed as compared to conventional internally circulating FBR's.

Because the pre-reaction gas velocity is higher than the reaction gas velocity, there is little, if any, leakage of reaction gas into the pre-reaction heating zone, thereby minimizing dust formation and deposition of silicon on the walls within the pre-reaction heating zone.

Because the particles are relatively hotter at the top of the reaction zone and cooler at the bottom of the reaction zone, the reaction gas is also hotter at the top of the reaction zone, where the silicon concentration is lowest, and cooler at the bottom of the reaction zone, where the concentration of silicon is highest. As a result, formation of dust due to heating of the reaction gas is reduced, and silicon deposition by the reaction gas onto the walls of the reaction zone is minimized.

In embodiments, the at least one vertical separator that separates the pre-reaction heating zone from the reaction zone is thermally insulating, so that heating of the walls of the reaction zone is reduced, and the temperature of the walls is minimized. This further reduces deposition of silicon onto the walls of the reaction zone. In some of these embodiments, the vertical separator is either made from an insulating material or filled with an insulating material. In other embodiments, the vertical separator includes double walls separated by an evacuated or gas-filled space.

The FBR of the present invention also removes trapped and adsorbed hydrogen from the silicon particles. In some embodiments, the pre-reaction heating zone also functions as a dehydrogenation zone. In other embodiments, a separate dehydrogenation zone is provided. In various embodiments, the flow rates of the gases are adjusted so as to cause the silicon particles to circulate, on average, at least 50 times between the reaction and dehydrogenation zones of the reactor, so that the particles are repeatedly dehydrogenated almost continuously during the reaction process, rather than in a single step after the reaction process is completed.

In some embodiments, the gas flows are continuous during the reaction, while in other embodiments pulses of gas are used to transfer the silicon particles all at once between the zones.

The reaction chamber can be cylindrical, rectangular, or any other suitable shape, and can be divided into zones that are side-by-side or concentric.

One general aspect of the present invention is a method for producing polysilicon. The method includes providing an internally recirculating fluidized bed reactor having at least one vertical separator that creates within the reactor a pre-reaction heating zone, a reaction zone, and a dehydrogenation zone, said zones being in particle communication with each other. The method further includes introducing polysilicon particles into the reactor, and introducing a pre-reaction fluidizing gas into the pre-reaction heating zone, a reaction gas comprising at least one silicon-containing reagent into the reaction zone, and a dehydrogenation gas into the dehydrogenation zone, each of said gases being introduced at a velocity that is at least equal to a minimum fluidizing velocity for the polysilicon particles.

The velocities of the gases are controlled so as to cause the polysilicon particles to circulate upward through the pre-reaction heating zone, downward through the reaction zone, and through the dehydrogenation zone, whereby the polysilicon particles are heated in the pre-reaction heating zone to a reaction temperature that is above a minimum reaction temperature for the reaction gas, silicon is deposited from the reaction gas onto the polysilicon particles in the reaction zone, and the polysilicon particles are heated in the dehydrogenation zone to a temperature that is sufficient to remove hydrogen gas from the polysilicon particles, so that the circulation causes the polysilicon particles to be converted to silicon product. Finally, the method includes removing the silicon product from the reactor.

In some embodiments, the polysilicon particles circulate continuously between the zones. In other embodiments, the velocities of the gases are increased as the polysilicon particles increase in mass due to deposition thereupon of silicon by the reaction gas.

Some embodiments further include varying the velocities of the gases introduced into the zones so as to control movement of the polysilicon particles between the zones. And in some of these embodiments, the polysilicon particles circulate in pulses between the zones.

In exemplary embodiments, the dehydrogenation zone is distinct from the pre-reaction heating zone. In other embodiments, the pre-reaction heating zone is the dehydrogenation zone, the pre-reaction fluidizing gas is the dehydrogenation gas, and the polysilicon particles are heated in the pre-reaction heating zone to a temperature that is sufficient to remove hydrogen gas from the polysilicon particles as they circulate upward through the pre-reaction heating zone, downward through the reaction zone, and upward again through the pre-reaction heating zone.

In some embodiments, the pre-reaction heating zone surrounds the reaction zone. And in some of these embodiments, the vertical divider is cylindrical.

In various embodiments, the silicon-containing reaction gas includes silane ($SiH_4$) gas. And in some of these embodiments, the silicon-containing reaction gas is a mixture of silane and hydrogen.

In certain embodiments, the pre-reaction fluidizing gas, the silicon-containing reaction gas, and/or the dehydrogenation fluidizing gas includes hydrogen gas.

Exemplary embodiments further include reducing a temperature of the silicon-containing reaction gas to cool the polysilicon particles to a desired reaction temperature in the reaction zone. And in some embodiments the separator includes at least one of a vacuum space and a thermally insulating material having a thermal conductivity of less than 0.5 W/(m-K).

Another general aspect of the present invention is an internally recirculating fluidized bed reactor. The fluidized bed reactor includes at least one vertical separator creating within the reactor a pre-reaction heating zone, a reaction zone, and a dehydrogenation zone, said zones being in particle communication with each other, a polysilicon particle inlet for introducing polysilicon particles into the reactor, a pre-reaction heater for heating the polysilicon particles to a reaction temperature in the pre-reaction zone, a dehydrogenation heater for heating the polysilicon particles to a dehydrogenating temperature in the dehydrogenation zone, a pre-reaction gas inlet for introducing pre-reaction fluidizing gas into the pre-reaction heating zone, a reaction gas inlet for introducing a reaction gas comprising at least one silicon-containing reagent into the reaction zone, a dehydrogenation gas inlet for introducing dehydrogenation fluidizing gas into the dehydrogenation zone, at least one gas outlet, a silicon product outlet, a heater control system that controls heat applied by the pre-reaction and dehydrogenation heaters, and a gas control system that controls the velocities at which the gases are introduced into their corresponding zones, said gas control system being configured to cause the polysilicon particles to cycle upward through the pre-reaction heating zone, downward through the reaction zone, and through the dehydrogenation zone until the polysilicon particles are converted to silicon product.

In embodiments, the gas control system is configured to circulate the polysilicon particles continuously between the zones.

In various embodiments the gas control system is configured to increase the velocities of the gases as the polysilicon particles increase in mass due to deposition thereupon of silicon by the reaction gas.

In exemplary embodiments, the gas control system is configured to vary the velocities at which the gases are introduced into the zones so as to control movement of the polysilicon particles between the zones. And in some of these embodiments the gas control system is configured to circulate the polysilicon particles in pulses between the zones.

In some embodiments, the dehydrogenation zone is distinct from the pre-reaction heating zone. In other embodiments, the pre-reaction heating zone is the dehydrogenation zone, the pre-reaction heater is the dehydrogenation heater, the pre-reaction fluidizing gas is the dehydrogenation gas, and the gas control system is configured to cause the polysilicon particles to cycle upward through the pre-reaction heating zone, downward through the reaction zone, and upward again through the dehydrogenation zone until the polysilicon particles are converted to silicon product. In some of these embodiments, the pre-reaction heating zone surrounds the reaction zone. And in some of these embodiments the vertical divider is cylindrical.

And in various embodiments the separator includes at least one of a vacuum space and a thermally insulating material having a thermal conductivity of less than 0.5 W/(m-K).

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

The present invention is a reverse internally circulating fluidized bed reactor (FBR) that minimizes production of silicon dust, minimizes deposition of silicon on the walls and zone dividers, and produces silicon product with reduced hydrogen content, so that a separate dehydrogenation step is not needed after the silicon product is removed from the reactor. The reactor provides a pre-reaction heating gas flow that is able to lift particles of polysilicon upward through the pre-reaction heating zone, so that they enter the reaction zone and first encounter the reaction gas at the top of the reaction zone. The flow of reaction gas is relatively weaker, so that the particles slowly settle through the reaction zone and re-enter the bottom of the pre-reaction heating zone. As a result, the circulation of the silicon particles through the present invention is reversed as compared to conventional internally circulating FBR's.

Figure 2:
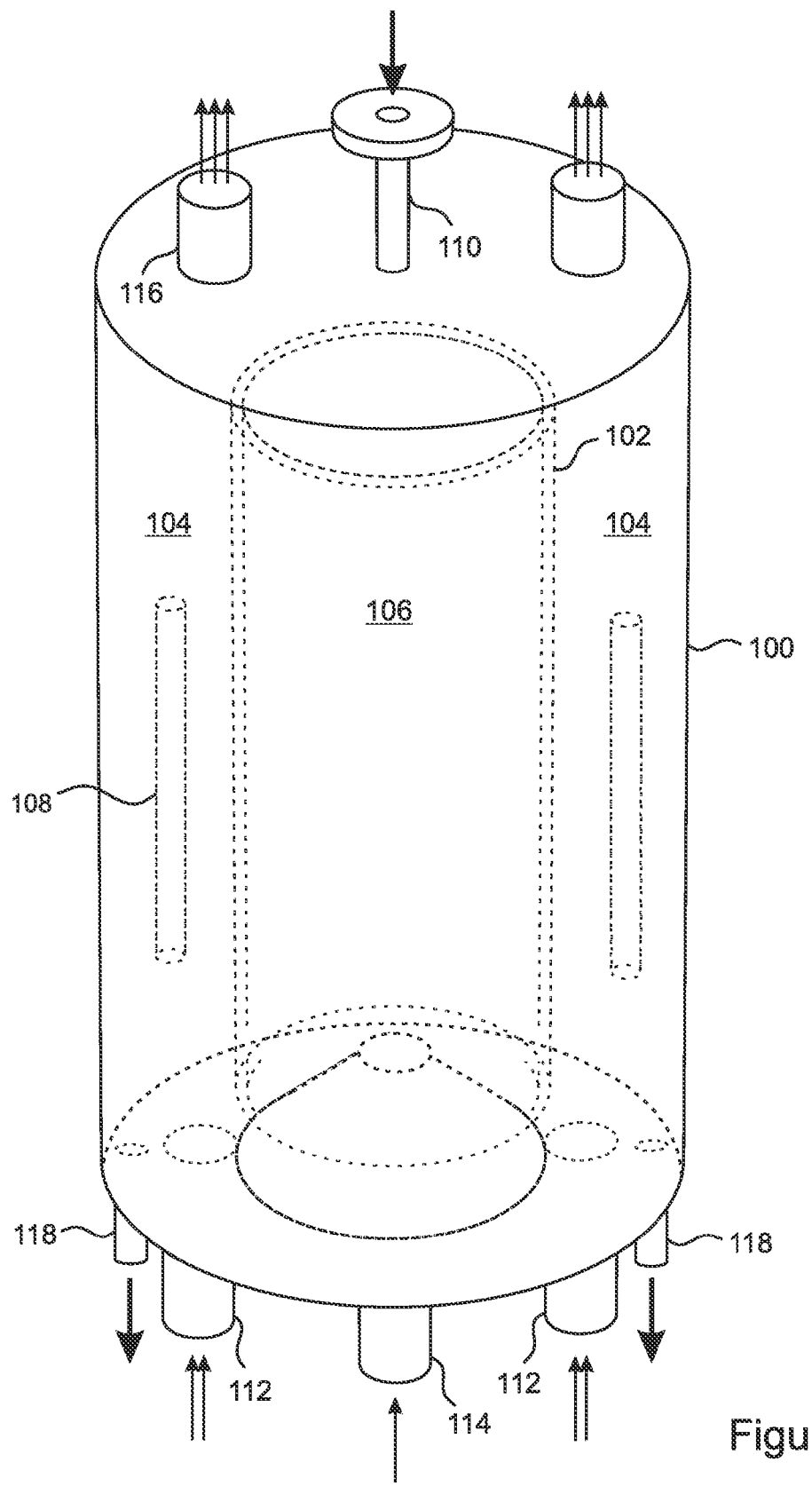
FIG. 2 is a perspective view of an embodiment of the present invention wherein the heating and reaction zones are concentric, heaters are included within the heating zone, and the heating zone also serves as the dehydrogenation zone.

A cylindrical embodiment of the present invention is illustrated in FIG. 2. The reactor chamber 100 is divided into a pre-reaction heating zone 104 and a concentric reaction zone 106 by a cylindrical, vertical separator 102. In the pre-reaction heating zone 104, which also functions in this embodiment as the dehydrogenation zone, the silicon particles are fluidized by a pre-reaction gas introduced through a pre-reaction gas port 112. In various embodiments, the pre-reaction gas is either pure hydrogen or another silicon-free gas, such as nitrogen. In the reaction zone 106, the particles are fluidized by a reaction gas that comprises at least one silicon reagent and is introduced into the reaction zone 106 through a reaction gas port 114. The reaction gas in the embodiment of FIG. 2 is a mixture of silane and hydrogen. In similar embodiments, the reaction gas is a mixture of nitrogen or some other inert gas with a gas comprising at least one silicon-containing reagent.

Silicon particles can move between zones by flowing over the top or under the bottom of the vertical separator 102, thereby allowing for internal circulation of the particles between the zones according to the relative flow velocities of the fluidizing gases. The gas flow velocities are controlled by a controller (not included in the figure), so as to cause the particles to flow upward through the pre-reaction heating zone 104 and downward through the reaction zone 106.

In the pre-reaction heating zone 104, the particles are heated to a temperature that is somewhat higher than the deposition temperature, for example to 650° C. for a silane-containing reaction gas, as they move upward toward the top of the pre-reaction heating zone 104.

The reaction gas enters the reaction zone 106 at a temperature that is much lower than the homogeneous nucleation (dust-forming) temperature. As the reaction gas rises through the reaction zone 106, the silicon reagent in the reaction gas decomposes on the hot surfaces of the particles and deposits polysilicon thereupon. In the case of a silane-containing reaction gas, the silane is decomposed in embodiments with near 100% conversion via the reaction: $SiH_4 \Rightarrow Si + 2H_2$. This can be compared with a traditional Siemens chemical vapor deposition (CVD) reactor, in which cold reaction gas encounters a hot silicon filament rod. As the hot silicon particles fall through the reaction zone 106, heat is transferred from the hotter particles to the relatively colder reaction gas. Since the reaction gas is at its lowest temperature at the bottom of the reaction zone 106, where the concentration of silane in the gas is highest and where a majority of the silicon decomposition typically takes place, the amount of dust formed through homogeneous nucleation and the amount of silicon deposited by the reaction gas onto the walls of the reaction zone are both minimized.

The pre-reaction fluidizing gas and the reaction gas both leave the reactor through one or more exhaust ports 116, while the silicon particles return under the vertical separator 102 and into the pre-reaction heating zone to be reheated. In various embodiments, the gas controller is configured to cause the silicon particles to circulate, on average, at least 50 times through the pre-reaction heating zone 104 and the reaction zone 106 before they are removed as silicon product.

Figure 1A:
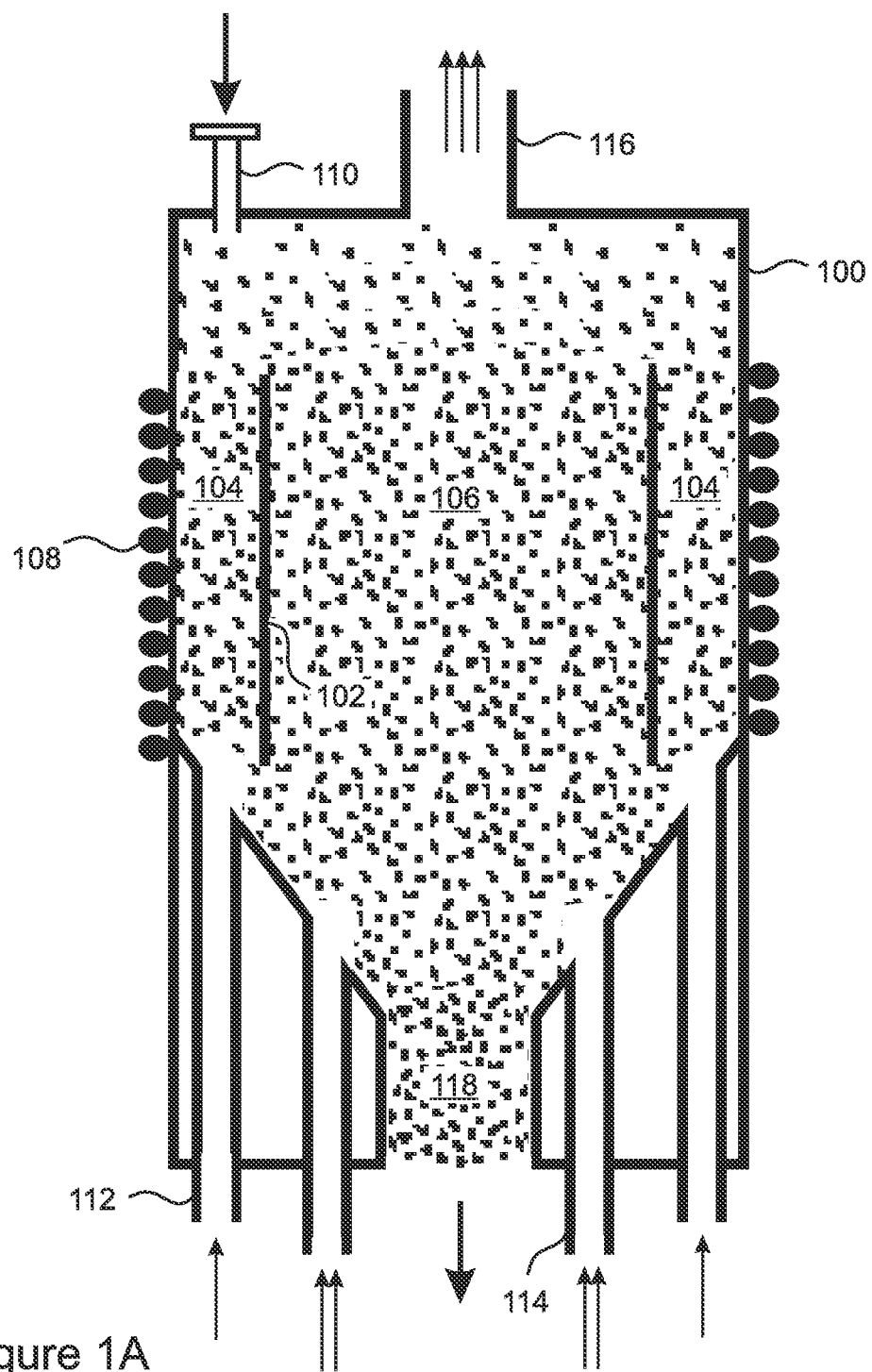
FIG. 1A illustrates a circulating fluidized bed reactor (FBR) of the prior art.
Figure 1B:
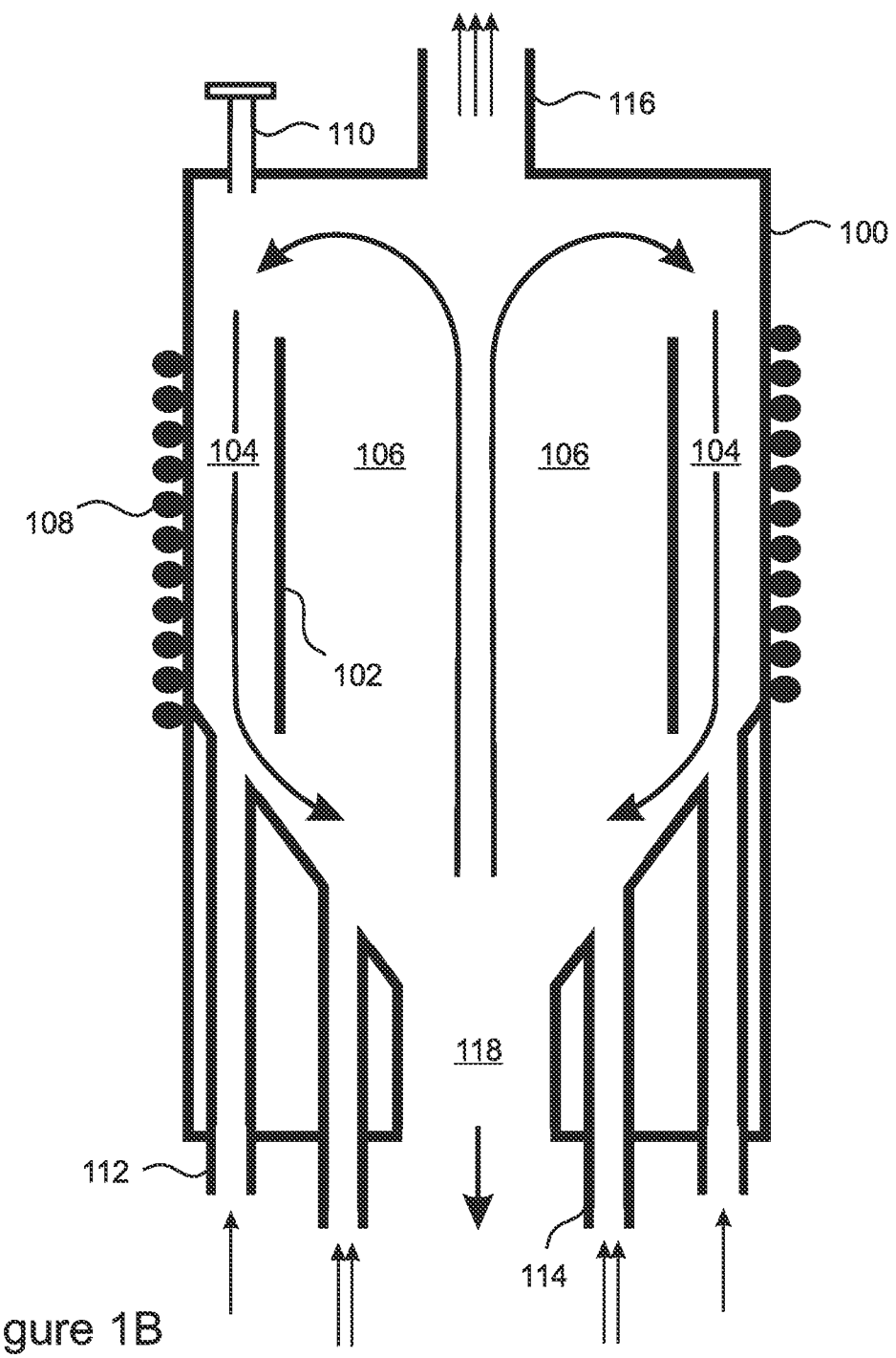
FIG. 1B illustrates the direction of circulation of the silicon particles through the heating and reaction zones in the FBR of FIG. 1A.
Figure 3:
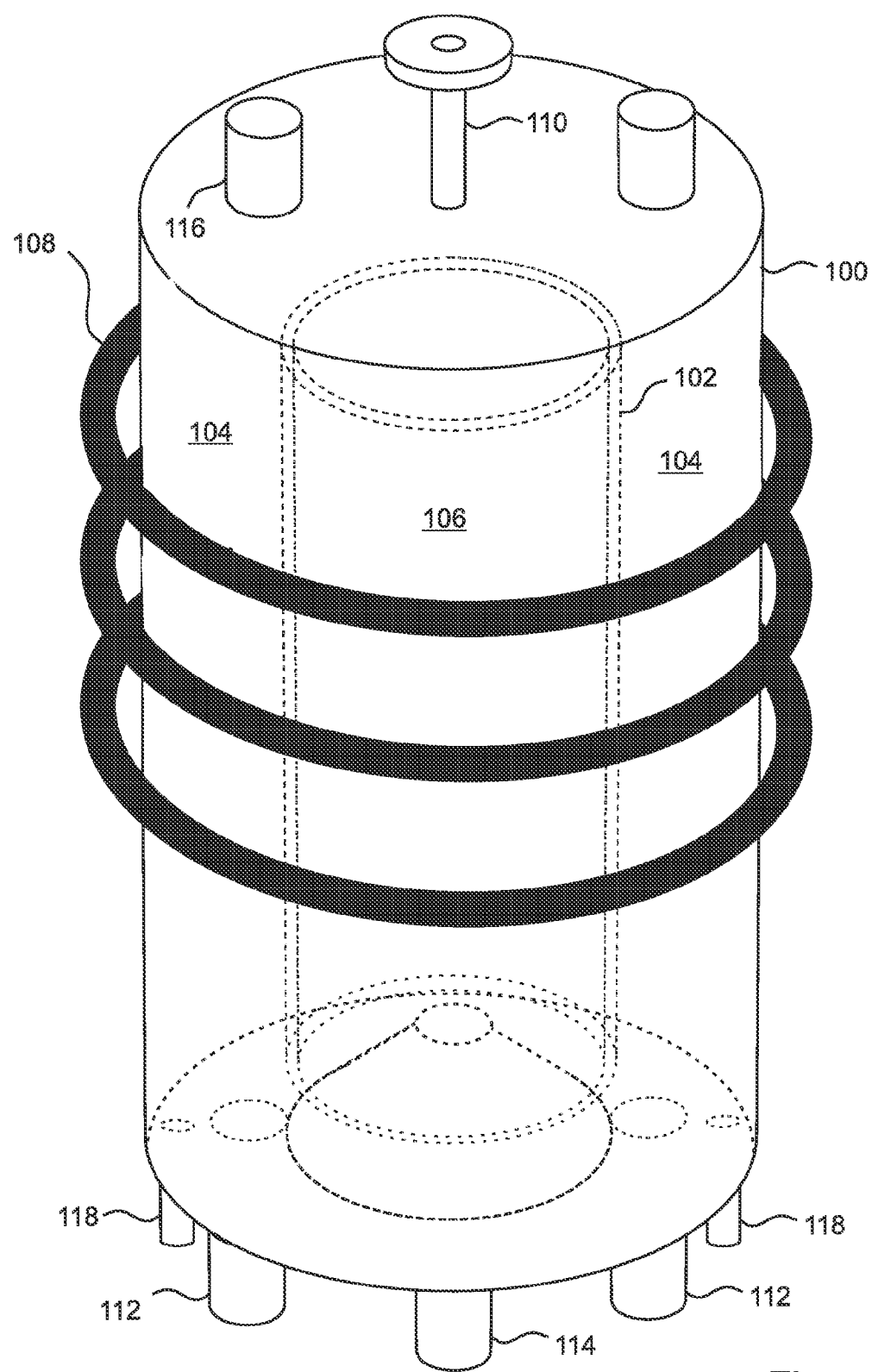
FIG. 3 is a perspective view of an embodiments similar to FIG. 2, except that the heater is external to the reactor chamber, and heats the heating zone by thermal conduction through the reactor chamber wall.
Figure 4:
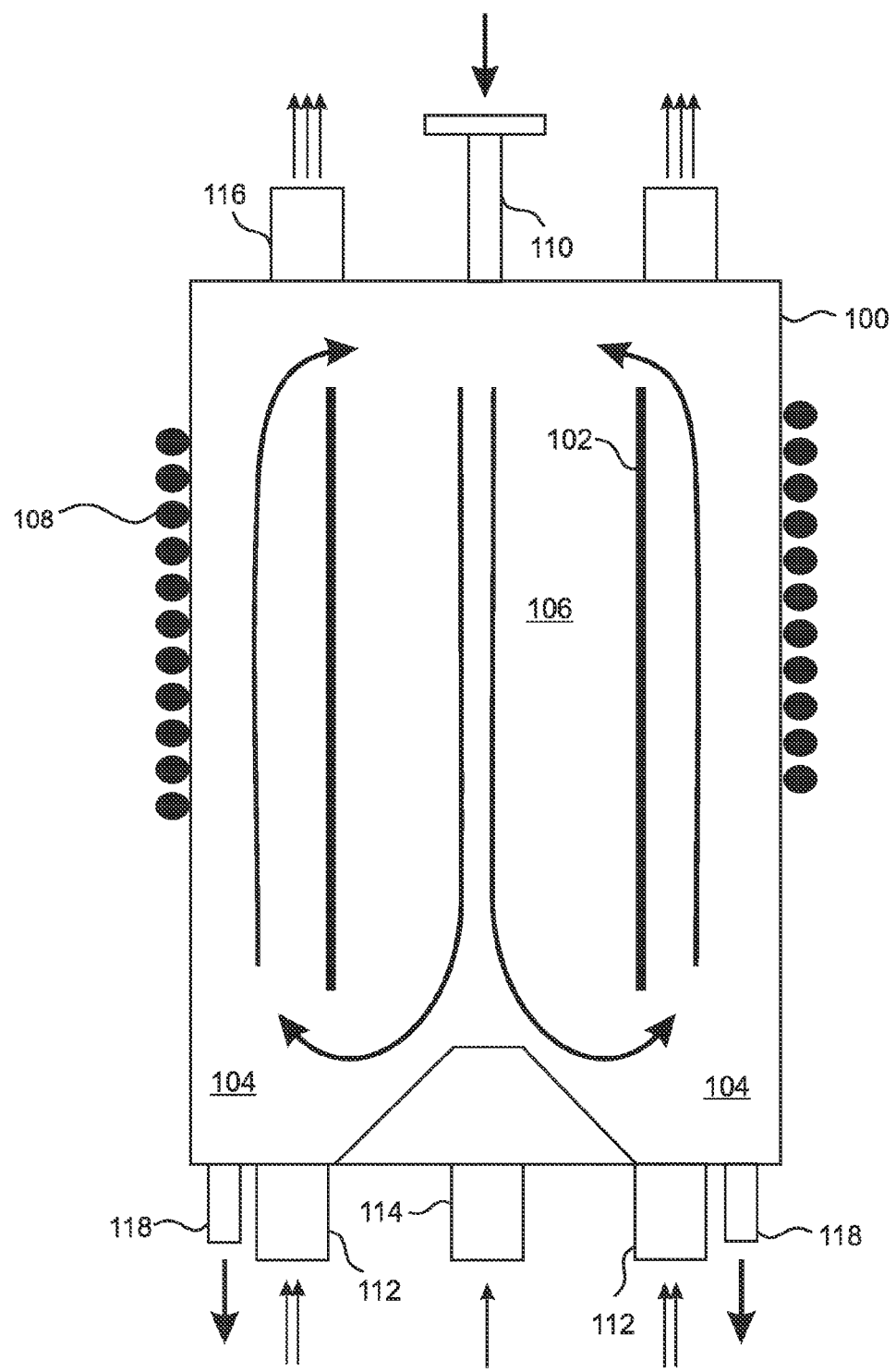
FIG. 4 is a cross-sectional view of the embodiment of FIG. 3, showing the reversed direction of flow of silicon particles through the heating and reaction zones, as compared to FIG. 1B.

In the embodiment of FIG. 2, the heaters 108 are located within the pre-reaction heating zone 104. Due to the high heat transfer rate between the heaters 108 and the silicon particles, the particle temperature inside the pre-reaction heating zone is nearly uniform. FIG. 3 illustrates a similar embodiment in which the heater is external to the reactor chamber 100 and heats the particles in the pre-reaction heating zone 104 by thermal conduction through the walls of the chamber 100. FIG. 4 is a cross sectional illustration of an embodiment similar to FIG. 3, showing the direction in which the silicon particles circulate within the reactor chamber 100. When compared with FIG. 1B, it is clear that the direction of particle circulation in the present invention is reversed as compared to the prior art.

Due to the higher flow velocity of the pre-reaction fluidizing gas as compared to the reaction gas, entry of reaction gas into the pre-reaction heating zone 104 is minimized or eliminated. As a result, deposition of silicon on the heaters, walls, or surfaces of the vertical separator 102 facing the pre-reaction heating zone 104 is minimized or eliminated.

Inside the reaction zone, there are no surfaces that are significantly hotter than the surfaces of the silicon particles. Silicon deposition will therefore predominantly occur on the surfaces of the silicon particles, and deposition on the walls of the reaction zone will be minimized or eliminated. In embodiments, the at least one vertical separator that separates the pre-reaction heating zone from the reaction zone is thermally insulating, having a thermal conductivity of, for example, less than 0.5 W/(m-K), so that heating of the walls of the reaction zone is minimized, and the walls are prevented from reaching the high temperature of the reaction gas. This further reduces deposition of silicon onto the walls of the reaction zone. In some of these embodiments, the vertical separator is either made from an insulating material or filled with an insulating material. In other embodiments, the vertical separator includes double walls with a gas-filled gap or evacuated space provided therebetween.

Figure 5:
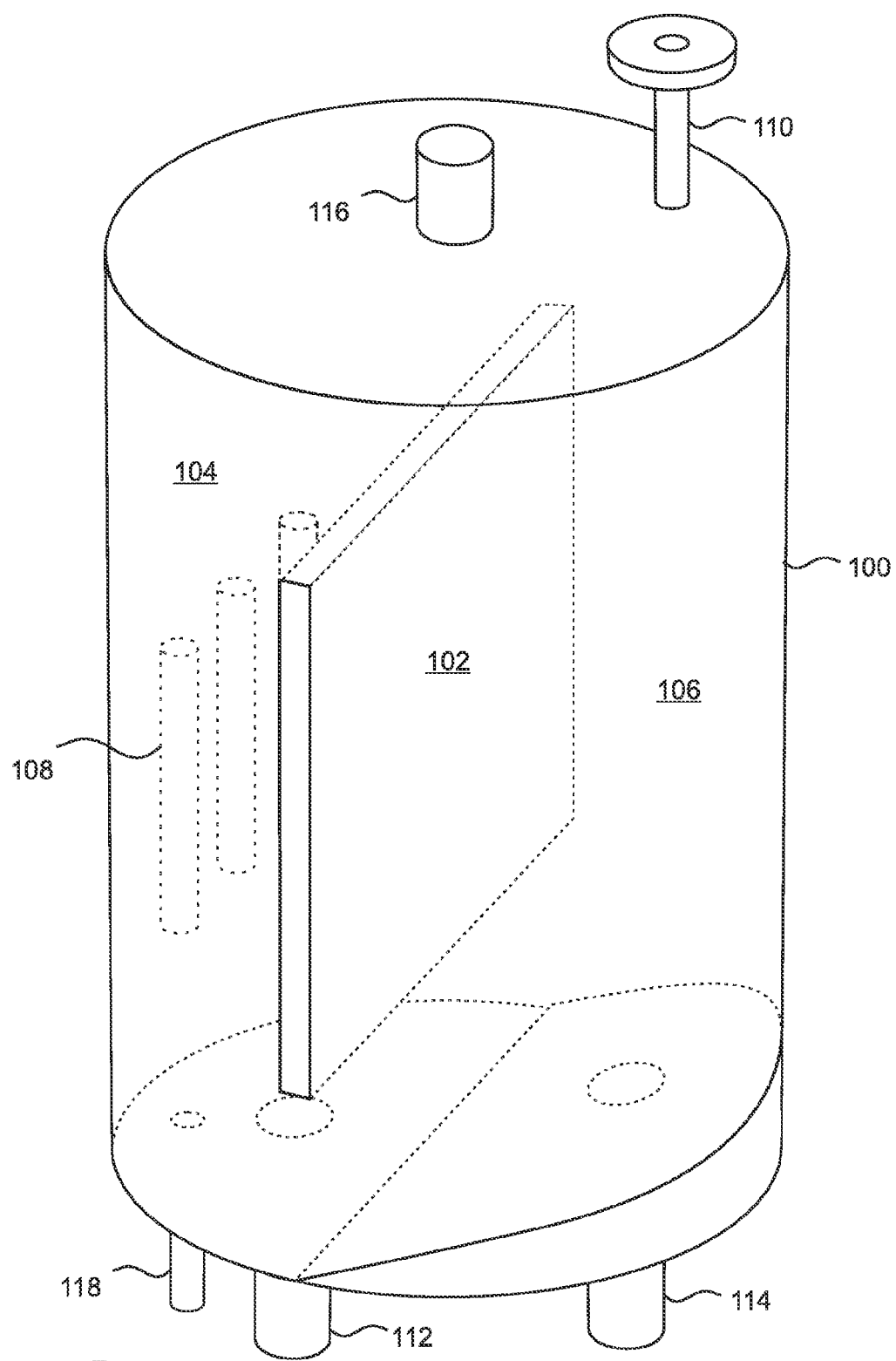
FIG. 5 is a perspective view of an embodiment similar to FIG. 2, except that the heating and reaction zones are side-by-side instead of concentric.
Figure 6:
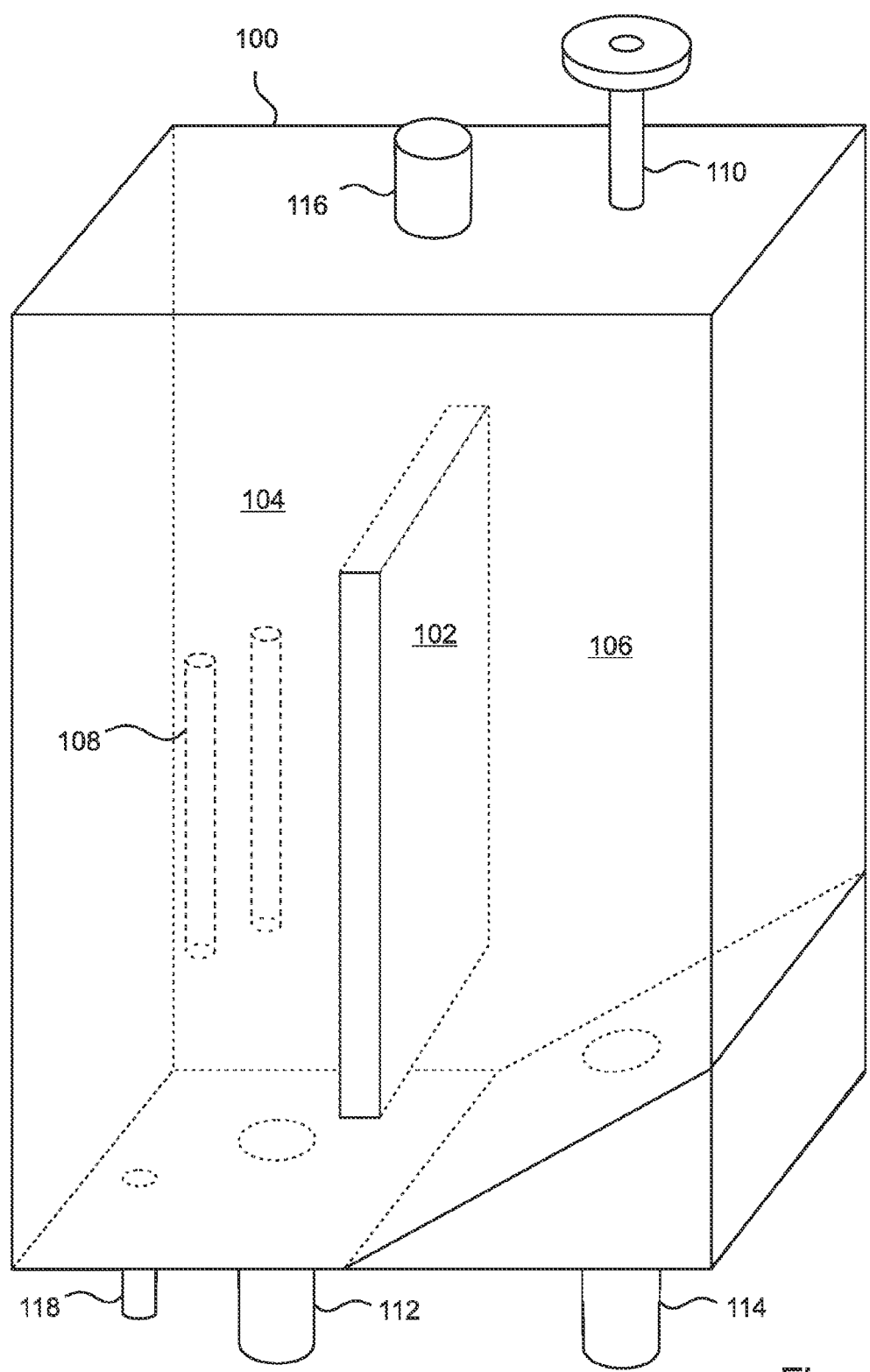
FIG. 6 is a perspective view of an embodiment similar to FIG. 5, except that the reactor chamber is rectangular.
Figure 7:
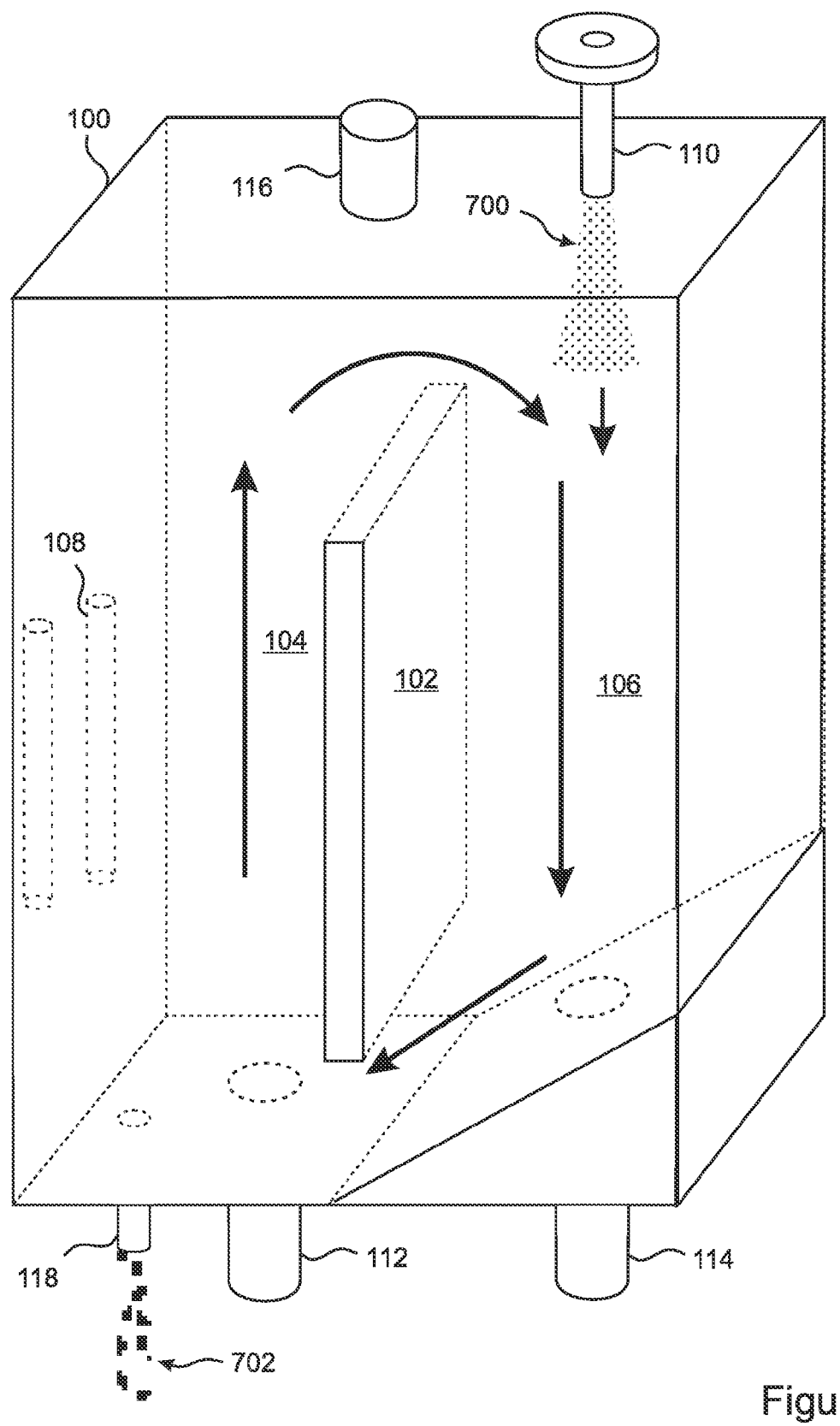
FIG. 7 is a perspective view of the embodiment of FIG. 6, showing the direction of flow of the silicon particles through the heating and reaction zones.

Many different FBR configurations are within the scope of the present invention. For example, FIG. 5 presents a cylindrical chamber 100 that is divided into two halves 104, 106 by a straight vertical divider 102, as compared to the embodiment of FIG. 2, where the vertical divider 102 is cylindrical and the zones 104, 106 are concentric. Another example is given in FIG. 6, where a rectangular chamber 100 is divided into two zones 104, 106 by a straight vertical divider 102. FIG. 7 illustrates the flow direction of the particles in the embodiment of FIG. 6, and also illustrates entry of seed particles 700 into the reaction zone 106 and removal of silicon product 702 from the pre-reaction heating zone 104.

As discussed above, it is well known that granular polysilicon produced in a fluidized bed reactor typically contains a certain amount of entrapped hydrogen gas, which can form bubbles when the silicon particles are removed from the FBR and melted, for example to form ingots or crystals. A typical solution of the prior art is to dehydrogenate the silicon particles either by transferring them to a separate dehydrogenation chamber, distinct from the FBR, or by returning them to the heating zone 104 of the FBR after a production run is completed, fluidizing the particles by hydrogen gas and heating the particles to a high temperature, typically hotter than the temperature used during the FBR reaction, so as to remove at least some of the hydrogen from the particles.

In contrast, according to embodiments of the present invention, both silicon deposition and dehydrogenation occur simultaneously within a single fluidized bed reactor. In some embodiments, such as the embodiments of FIGS. 2-6, the pre-reaction heating zone also serves as the dehydrogenation zone. In some of these embodiments, the gas controller (not shown) is configured to cause the silicon particles to continuously circulate many times through the two zones 104, 106, so that the particles are repeatedly purged of hydrogen while passing through the pre-reaction heating zone 104. In some embodiments, the particles circulate, on average, at least 50 times through the two zones 104, 106 before emerging from the reactor. In this way, hydrogen gas is removed continuously from the surfaces of the recirculating particles before it can become entrapped beneath additional layers of deposited silicon.

Figure 8:
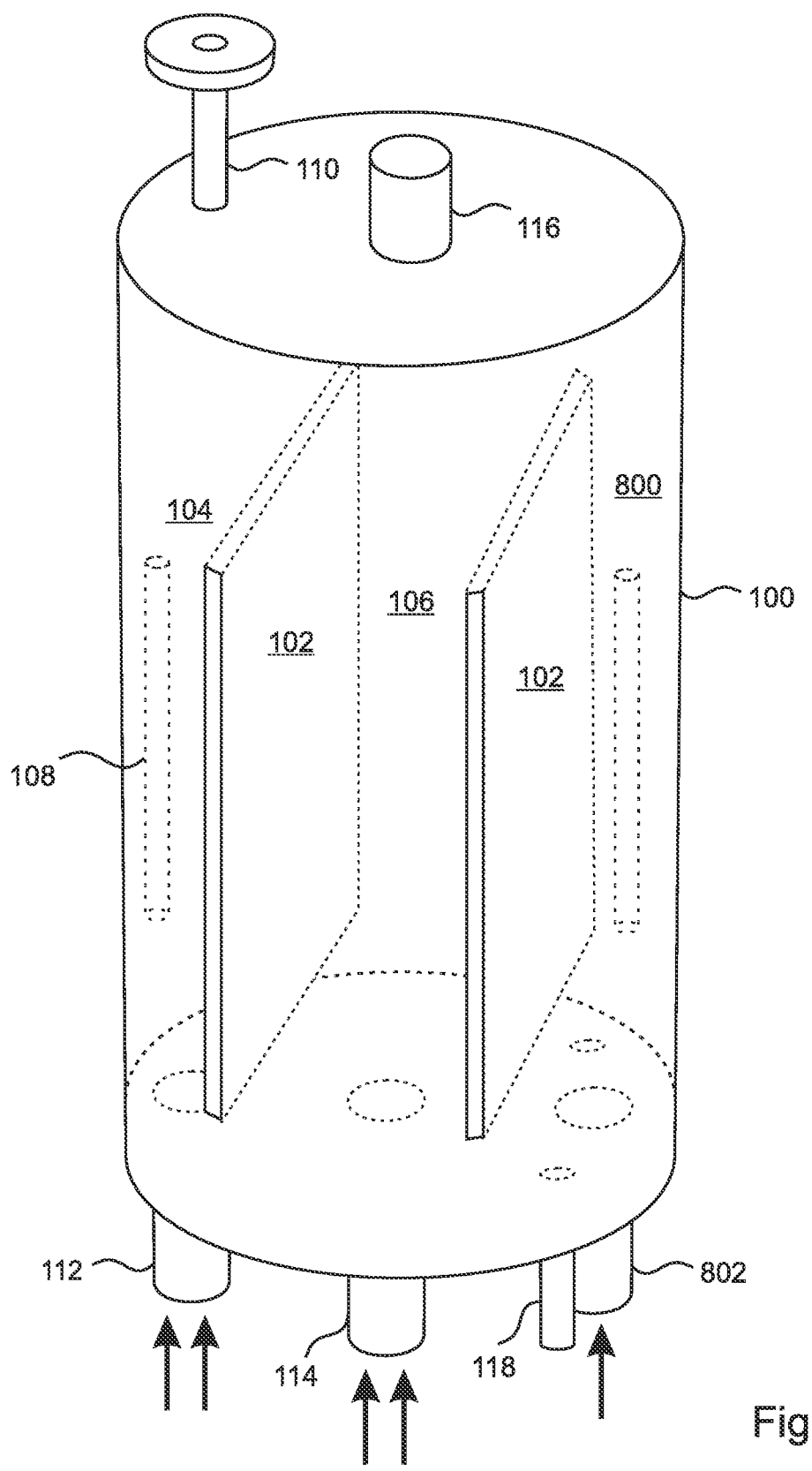
FIG. 8 is a perspective view of an embodiment similar to FIG. 5, except that the reactor chamber is divided into three zones, whereby the dehydrogenation zone is distinct from the heating and reaction zones.

FIG. 8 illustrates an embodiment in which the dehydrogenation zone 800 is distinct from the pre-reaction heating zone 104 and is fluidized by a separate flow of silicon-free dehydrogenation gas introduced into the zone 800 through a dehydrogenation gas port 802. In this embodiment, the gas controller is configured to apply pulses of gas that transfer the particles as a group from one zone to the other. For example, gas can be applied simultaneously to the reaction zone 106 and the dehydrogenation zone 800 so as to shift the particles into the pre-reaction heating zone 104. Alternatively, gas can be applied simultaneously to the reaction zone 106 and the pre-reaction heating zone 104 so as to shift the particles into the dehydrogenation zone 800.

The foregoing description of the embodiments of the invention has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure.

Although the present application is shown in a limited number of forms, the scope of the invention is not limited to just these forms, but is amenable to various changes and modifications without departing from the spirit thereof. The disclosure presented herein does not explicitly disclose all possible combinations of features that fall within the scope of the invention. The features disclosed herein for the various embodiments can generally be interchanged and combined into any combinations that are not self-contradictory without departing from the scope of the invention. In particular, the limitations presented in dependent claims below can be combined with their corresponding independent claims in any number and in any order without departing from the scope of this disclosure, unless the dependent claims are logically incompatible with each other.

We claim:

1. A method for producing a silicon product from polysilicon, comprising:
   providing an internally recirculating fluidized bed reactor having at least one vertical separator that creates within the reactor a pre-reaction heating zone, a reaction zone, and a dehydrogenation zone, said zones being in particle communication with each other;
   introducing polysilicon particles into the reactor;
   introducing a pre-reaction fluidizing gas into the pre-reaction heating zone, a reaction gas comprising silane ($SiH_4$) into the reaction zone, and a dehydrogenation gas into the dehydrogenation zone, each of said gases being introduced at a velocity that is at least equal to a minimum fluidizing velocity for the polysilicon particles;
   controlling the velocities of the gases so as to cause the polysilicon particles to circulate upward through the pre-reaction heating zone, downward through the reaction zone, and through the dehydrogenation zone, whereby:
   the polysilicon particles are heated in the pre-reaction heating zone to a reaction temperature that is above a minimum reaction temperature for the reaction gas;
   silicon is deposited from the reaction gas onto the polysilicon particles in the reaction zone; and
   the polysilicon particles are heated in the dehydrogenation zone to a temperature that is sufficient to remove hydrogen gas from the polysilicon particles, said circulation causing the polysilicon particles to be converted to silicon product; and
   removing the silicon product from the reactor.

2. The method of claim 1, wherein the polysilicon particles circulate continuously between the zones.

3. The method of claim 1, wherein the velocities of the gases are increased as the polysilicon particles increase in mass due to deposition thereupon of silicon by the reaction gas.

4. The method of claim 1, further comprising varying the velocities of the gases introduced into the zones so as to control movement of the polysilicon particles between the zones.

5. The method of claim 4, wherein the polysilicon particles circulate in pulses between the zones.

6. The method of claim 1, wherein the dehydrogenation zone is distinct from the pre-reaction heating zone.

7. The method of claim 1, wherein the pre-reaction heating zone is the dehydrogenation zone, the pre-reaction fluidizing gas is the dehydrogenation gas, and the polysilicon particles are heated in the pre-reaction heating zone to a temperature that is sufficient to remove hydrogen gas from the polysilicon particles as they circulate upward through the pre-reaction heating zone, downward through the reaction zone, and upward again through the pre-reaction heating zone.

8. The method of claim 1, wherein the pre-reaction heating zone surrounds the reaction zone.

9. The method of claim 8, wherein the vertical divider is cylindrical.

10. The method of claim 1, wherein the reaction gas is a mixture of silane and hydrogen.

11. The method of claim 1, wherein at least one of the pre-reaction fluidizing gas, the reaction gas, and the dehydrogenation gas includes hydrogen gas.

12. The method of claim 1, further comprising reducing a temperature of the reaction gas to cool the polysilicon particles to a desired reaction temperature in the reaction zone.

13. The method of claim 1, wherein the separator includes at least one of a vacuum space and a thermally insulating material having a thermal conductivity of less than 0.5 W/(m-K).

* * * * *